(12) United States Patent
Jeong et al.

(10) Patent No.: US 7,995,023 B2
(45) Date of Patent: Aug. 9, 2011

(54) FLAT PANEL DISPLAY AND METHOD FOR DRIVING THE SAME

(75) Inventors: Jae Kyeong Jeong, Yongin (KR); Jae Bon Koo, Yongin (KR); Hyun Soo Shin, Yongin (KR); Se Yeoul Kwon, Yongin (KR); Yeon Gon Mo, Yongin (KR); Keum Nam Kim, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 950 days.

(21) Appl. No.: 11/478,169

(22) Filed: Jun. 28, 2006

(65) Prior Publication Data

US 2007/0001928 A1 Jan. 4, 2007

(30) Foreign Application Priority Data

Jun. 29, 2005 (KR) .................. 10-2005-0057156
Jul. 15, 2005 (KR) .................. 10-2005-0064267

(51) Int. Cl.
*G09G 3/38* (2006.01)
(52) U.S. Cl. .......................... 345/92; 257/59
(58) Field of Classification Search .......... 257/66, 257/659, 660, 59; 345/80, 92; 438/28; 349/149–152
See application file for complete search history.

(56) References Cited

U.S. PATENT DOCUMENTS

| 6,215,244 | B1 * | 4/2001 | Kuribayashi et al. ......... 313/505 |
| 6,288,324 | B1 * | 9/2001 | Komori et al. ............... 136/244 |
| 6,344,885 | B1 | 2/2002 | Mori et al. |
| 6,518,676 | B2 | 2/2003 | Chikama et al. |
| 6,537,890 | B2 * | 3/2003 | Joo et al. ..................... 438/404 |
| 6,642,092 | B1 | 11/2003 | Voutsas et al. |
| 6,765,249 | B2 | 7/2004 | Voutsas et al. |
| 7,538,763 | B2 * | 5/2009 | Kamijo ....................... 345/212 |

(Continued)

FOREIGN PATENT DOCUMENTS

CN 1532946 A 9/2004

(Continued)

OTHER PUBLICATIONS

JPO Office action dated Feb. 17, 2009 for corresponding Japanese application No. 2006-167512, noting references listed in this IDS.

(Continued)

*Primary Examiner* — Alexander S Beck
*Assistant Examiner* — Aaron Midkiff
(74) *Attorney, Agent, or Firm* — Christie, Parker & Hale, LLP (57) ABSTRACT

A flat panel display and method for driving the same. The flat panel display includes a conductive substrate forming an image display unit having at least one thin film transistor and a pad unit including a plurality of terminals, wherein the conductive substrate is laminated with a plurality of insulating layers to form the image display unit and the pad unit; a substrate-exposing part for exposing the conductive substrate is formed by removing at least one area of the insulating layers formed on the pad unit; a system control panel for supplying a reverse bias voltage through the substrate-exposing part, wherein the system control panel is electrically connected with the pad unit; and a metal member for transferring the reverse bias voltage to the conductive substrate, wherein the metal member is formed between the substrate-exposing part and the system control panel.

22 Claims, 7 Drawing Sheets

U.S. PATENT DOCUMENTS

| | | | |
|---|---|---|---|
| 2002/0034842 A1 | 3/2002 | Joo et al. | |
| 2002/0105263 A1* | 8/2002 | Kim | 313/498 |
| 2003/0058379 A1 | 3/2003 | Lee | |
| 2003/0148567 A1 | 8/2003 | Joo et al. | |
| 2004/0012548 A1* | 1/2004 | Anzai | 345/76 |
| 2004/0212012 A1 | 10/2004 | Yamazaki et al. | |

FOREIGN PATENT DOCUMENTS

| | | |
|---|---|---|
| EP | 0 544 069 A1 | 6/1993 |
| EP | 0 999 595 A2 | 5/2000 |
| JP | 8-263021 | 10/1996 |
| JP | 9-269482 | 10/1997 |
| JP | 10-161095 | 6/1998 |
| JP | 11-298002 | 10/1999 |
| JP | 2000-196102 | 7/2000 |
| JP | 2003-66867 | 3/2003 |
| JP | 2003-280034 | 10/2003 |
| JP | 2004-006870 | 1/2004 |
| JP | 2004-214281 | 7/2004 |
| JP | 2004-309359 | 11/2004 |
| KR | 10-1994-0001638 | 2/1994 |
| KR | 10-2004-0105359 | 12/2004 |
| WO | WO 02/084739 A1 | 10/2002 |

OTHER PUBLICATIONS

Patent Gazette dated Mar. 18, 2009 for corresponding Chinese Patent Application No. 200610094368.4 listing cited references.

Patent Abstract of Japan, Publication 2003-280034, Published Oct. 2, 2003, in the name of Amano.

Patent Abstract of Japan, Publication 2004-214281, Published Jul. 29, 2004, in the name of Maruyama, et al.

Patent Abstract of Japan, Publication 2004-309359, Published Nov. 4, 2004, in the name of Fukuda.

Korean Patent Abstracts, Publication 1020040105359 A, Published Dec. 16, 2004, in the name of Kim, et al.

Korean Office action dated Jun. 16, 2006 for Korean priority 10-2005-0064267.

Patent Abstracts of Japan, Publication No. 09-269482, dated Oct. 14, 1997, in the name of Akira Honma.

Patent Abstracts of Japan, Publication No. 2003-066867, dated Mar. 5, 2003, in the name of Kazuhiko Tokunaga et al.

European Search Report dated Sep. 6, 2006, for EP06253405.2, in the name of Samsung SDI Co., Ltd.

* cited by examiner

FLAT PANEL DISPLAY AND METHOD FOR DRIVING THE SAME

CROSS-REFERENCE TO RELATED APPLICATIONS

This application claims priority to and the benefit of Korean Patent Application Nos. 10-2005-0057156, filed on Jun. 29, 2005, and 10-2005-0064267, filed on Jul. 15, 2005, in the Korean Intellectual Property Office, the entire contents of which are incorporated herein by reference.

BACKGROUND

1. Field of the Invention

The present invention relates to a flat panel display and a method for driving the same, particularly to a flat panel display and a method for driving the same that enhance a characteristic of a thin film transistor by supplying a back bias to a conductive substrate through a metal member connected with an external system control panel and a ground unit formed on a substrate-exposing part of the conductive substrate, and/or that avoid cutdown and/or fluctuation of a threshold voltage generated by a lot of static and/or avoid undersired voltage from being supplied to the conductive substrate.

2. Discussion of Related Art

Recently, a technique for forming a thin film transistor by using a semiconductor layer formed on a substrate having an insulating surface has received a lot of attention. The thin film transistor can be broadly applied to an electronic device such as an Integrated Circuit (IC) or an electro optical apparatus. Since glass and/or quartz is used to form the thin film transistor, the thin film transistor can be fragile and/or relatively thick and heavy. However, an electronic device, particularly for example, a display device that uses the thin film transistor, should be light and not be too fragile.

In order to solve the problems associated with using a glass substrate, a material that is relatively thin and non-fragile has been suggested. For example, a thin film transistor formed on a conductive substrate has been suggested, and a switching element and a driver circuit of a flat display panel, which uses a conductive substrate material, are actively being studied.

Figure 1:
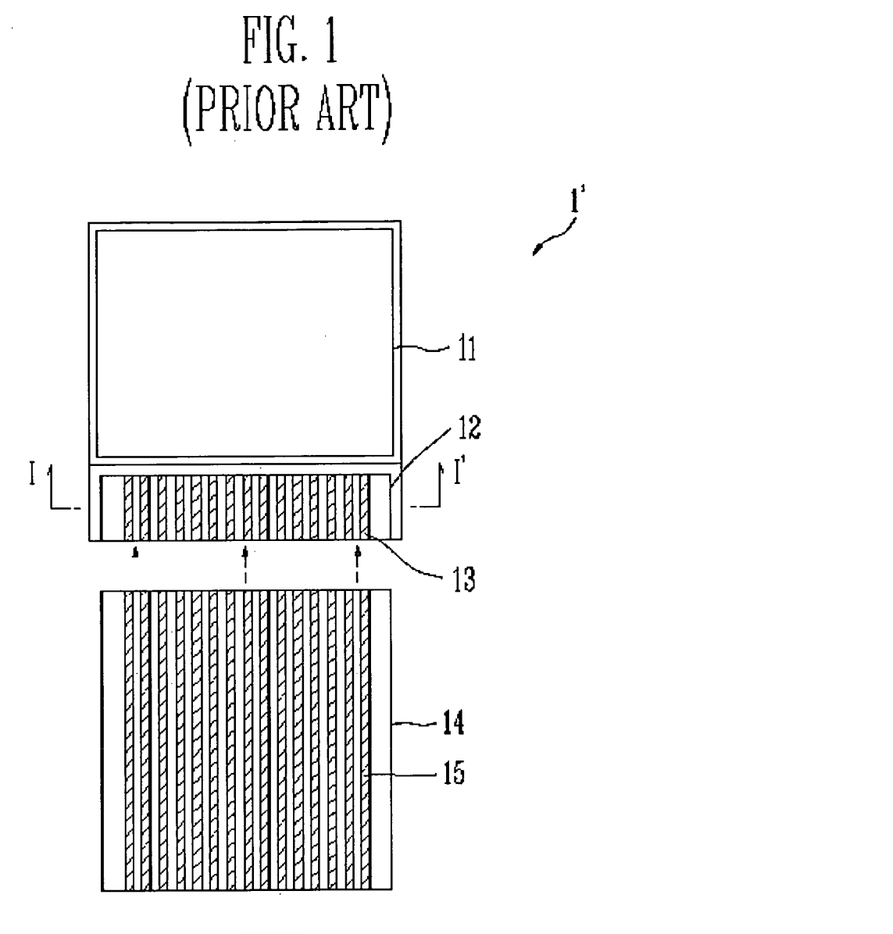
FIG. 1 illustrates a simplified plan view of a flat panel display according to the conventional art.
Figure 2:
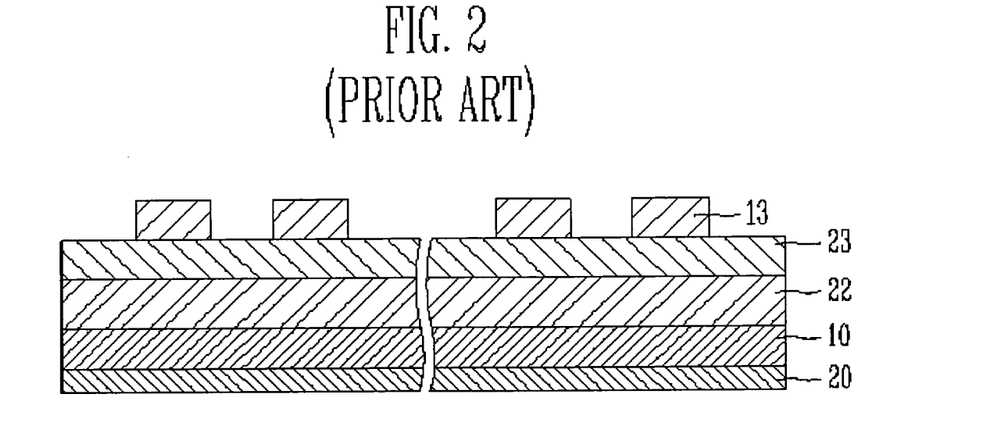
FIG. 2 illustrates a sectional view of a pad unit taken along the I-I' line in FIG. 1.

Referring to FIGS. 1 and 2, a conventional flat display panel including a conductive substrate forming a thin film transistor is shown.

FIG. 1 illustrates a simplified plan view of a flat panel display 1' according to the conventional art, and FIG. 2 illustrates a sectional view of a pad unit taken along the I-I' line in FIG. 1. Referring to FIGS. 1 and 2, the flat panel display 1' according to the conventional art includes a conductive substrate 10 forming an image display unit 11 and a pad unit 12, and an interface panel 14 electrically connected with the pad unit 12.

The picture display unit (or image display unit) 11 formed on the conductive substrate 10 includes a plurality of thin film transistors (not shown), and the pad unit 12 includes a buffer layer 22, an interinsulating layer 23 formed on the buffer layer 22, a plurality of terminals 13 formed on the interinsulating layer 23, and a lower insulating layer 20 formed on the under side of the conductive substrate 10.

The interface panel 14 forms a plurality of interface terminals 15, wherein the plurality of interface terminals 15 are formed on a position corresponding to the terminals 13 formed on the pad unit 12 and are to electrically connect with the terminals 13. Generally, the interface panel 14 can be divided into an embedded type storing a controller at its inside or an external type connected with a controller from the outside, and a Flexible Printed Circuit Board (FPCB) and an Integrated Circuit (IC) can be mainly used.

As mentioned above, one of characteristics of the conductive substrate 10, which forms a thin film transistor and/or the flat display panel 1', is that a threshold voltage of the thin film transistor can be changed in accordance with a back bias voltage applied to the conductive substrate 10.

Figure 3:
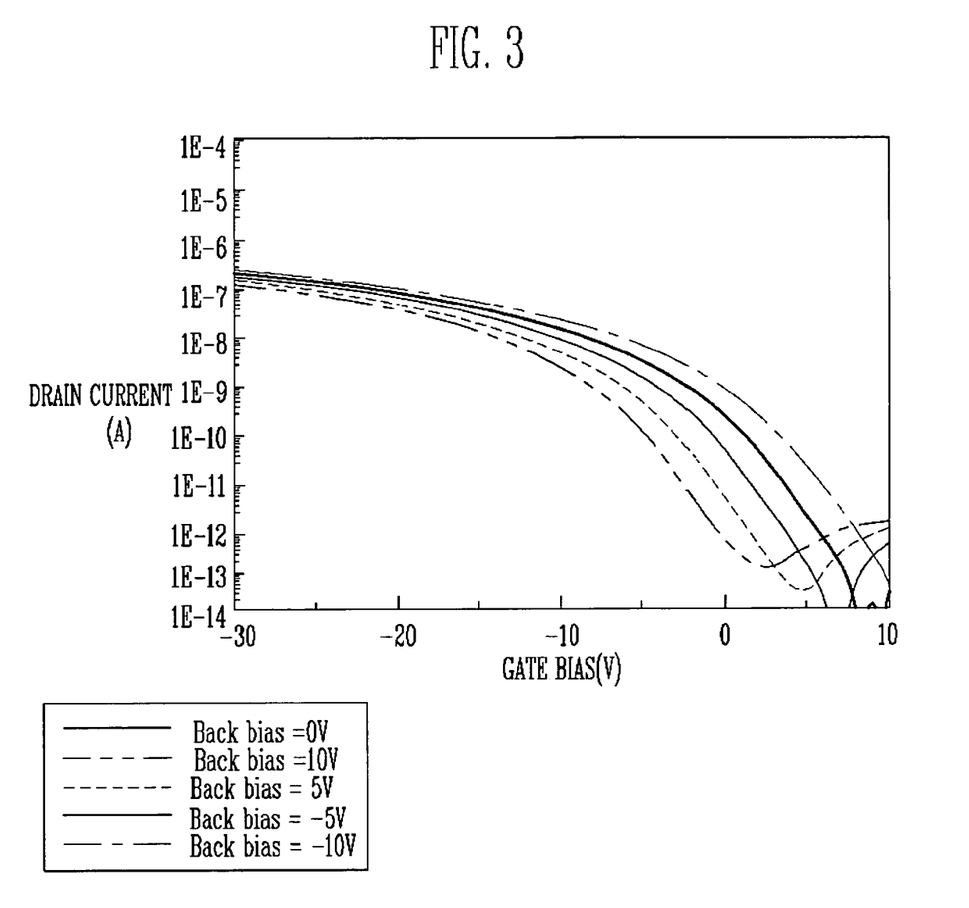
FIG. 3 illustrates an electrical characteristic cutdown in accordance with a back bias voltage supplied to a thin film transistor.

FIG. 3 illustrates electrical characteristic cutdown in accordance with a back bias voltage supplied to a thin film transistor.

As shown in FIG. 3, the X-axis represents a gate bias voltage supplied to a thin film transistor, and the Y-axis represents a drain current. As depicted in a graph, if a back bias voltage value supplied on a conductive substrate is high, a shift of a threshold voltage is increased. As a result, the threshold voltage can be tuned as a circuit type by adjusting a back bias voltage supplied on a conductive substrate forming a thin film transistor.

However, in a structure forming a thin film transistor on a conductive substrate, in the case that an undesired voltage is supplied to the conductive substrate caused by a lot of static and/or that an unpredicted electric charge is accumulated on the conductive substrate, a tuning as a circuit type becomes very difficult because a pre-adjusted threshold voltage of a thin film transistor is different from a reference designation value. Furthermore, it is problematic in that when a threshold voltage of a thin film transistor formed on a conductive substrate is different from a reference designation value, luminance, gray scale, and contrast that display respective colors displayed on a display device using a thin film transistor are changed.

SUMMARY OF THE INVENTION

Accordingly, it is an aspect of the present invention to provide a flat panel display and method for driving the same which can avoid electrical characteristic cutdown of a thin film transistor by adjusting a back bias voltage supplied to a conductive substrate.

In addition, it is another aspect of the present invention to provide a flat panel display and method for driving the same which can avoid undesired voltage from being supplied to a substrate forming a thin film transistor and fluctuation of a threshold voltage generated by a lot of static, etc.

Accordingly, it is a first aspect of the present invention to provide a flat panel display having: a conductive substrate forming an image display unit having at least one thin film transistor and a pad unit including a plurality of terminals, wherein the conductive substrate is laminated with a plurality of insulating layers to form the image display unit and the pad unit; a substrate-exposing part for exposing the conductive substrate is formed by removing at least one area of the insulating layers formed on the pad unit; a system control panel for supplying a back bias voltage through the substrate-exposing part, wherein the system control panel is electrically connected with the pad unit; and a metal member for transferring the back bias voltage to the conductive substrate, wherein the metal member is formed between the substrate-exposing part and the system control panel.

In one embodiment, the system control panel is electrically connected with the metal member and a corresponding one of the terminals through an interface panel, and further includes an interface terminal connected with a corresponding one of the terminals and the metal member, and a controller for adjusting the back bias voltage provided to the conductive substrate.

In one embodiment, the metal member includes a metal pin formed at a same height level as the terminals, and the thin film transistor is PMOS type, and wherein the reverse bias voltage supplied to the conductive substrate is a negative back bias voltage. In one embodiment, thin film transistor is NMOS type, and wherein the reverser bias voltage supplied to the conductive substrate is a positive back bias voltage. In one embodiment, the negative back bias voltage ranging from −0.1V to −20V is supplied to the conductive substrate. Also, the positive back bias voltage ranging from 0.1V to 20V is supplied to the conductive substrate.

In one embodiment, the pad unit formed with the corresponding one of the terminals and the metal member is press-connected with the interface panel by a conductive paste, and the substrate-exposing part is formed by completely removing the insulating layer formed on the conductive substrate. Also, the insulating layer is removed through a wet etching method, a dry etching method and/or a reactive ion etching method. Further, the metal member is formed by laminating a metallic material on the substrate-exposing part using either an evaporation method or a coating method, and by patterning the laminated metallic material. Moreover, the conductive substrate comprises Stainless Steel, titanium, molybdenum, iron, and/or cobalt.

According to a second aspect of the present invention, there is provided a method for driving a flat panel display including a conductive substrate forming an image display unit having at least one thin film transistor and a pad unit including a plurality of terminals, wherein the conductive substrate is laminated with a plurality of insulating layers to form the image display unit and the pad unit; a substrate-exposing part for exposing the conductive substrate is formed by removing at least one area of the insulating layers formed on the pad unit; a system control panel for supplying a back bias voltage through the substrate-exposing part, wherein the system control panel is electrically connected with the pad unit; and a metal member for transferring the back bias voltage to the conductive substrate, wherein the metal member is formed between the substrate-exposing part and the system control panel, the method comprising the step of: supplying the back bias voltage to the conductive substrate through the system control panel electrically connected with the substrate-exposing part.

According to a third aspect of the present invention, there is provided a flat panel display comprising a conductive substrate forming an image display unit and a pad unit including a plurality of terminals, wherein the conductive substrate is laminated with a plurality of insulating layers to form the image display unit and the pad unit; a substrate-exposing part formed on at least one area of the pad unit and exposing the conductive substrate, a metal member provided in the substrate-exposing part and contacting the conductive substrate and an interface panel for providing the conductive substrate with an external control signal, wherein the interface panel has an interface terminal connected with the pad unit and the metal member.

In one embodiment, the flat panel display further includes a ground part for grounding the conductive substrate, wherein the ground part is connected with the metal member, and a lower insulating layer formed under the conductive substrate.

BRIEF DESCRIPTION OF THE DRAWINGS

The accompanying drawings, together with the specification, illustrate exemplary embodiments of the present invention, and, together with the description, serve to explain the principles of the present invention.

The following detailed descriptions are given for the purpose of illustration only and are not intended to limit the scope of this invention.

DETAILED DESCRIPTION

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive. There may be parts shown in the drawings, or parts not shown in the drawings, that are not discussed in the specification as they are not essential to a complete understanding of the invention. Like reference numerals designate like elements. Here, when a first element is connected to/with a second element, the one element may be not only directly connected to/with the element but also indirectly connected to/with the second element via a third element.

Figure 4:
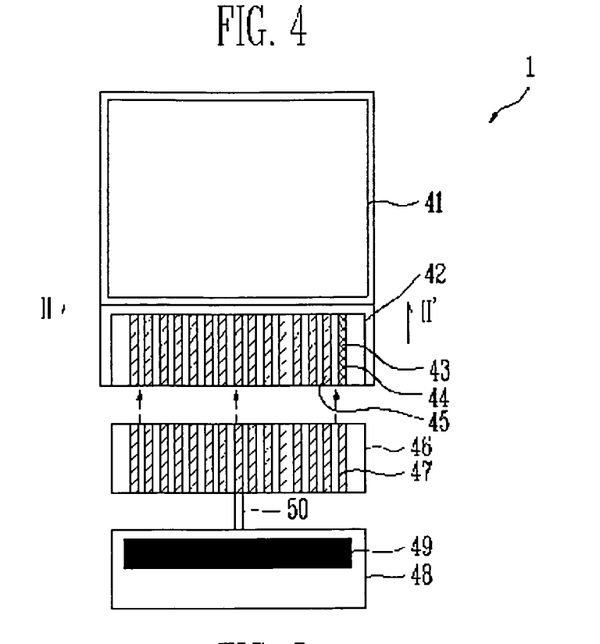
FIG. 4 illustrates a simplified plan view of a flat panel display according to an embodiment of the present invention.

Referring to FIGS. 4 through 11, embodiments of the present invention will be described in more detail. FIG. 4 illustrates a simplified plan view of a flat panel display 1 according to an embodiment of the present invention. Referring to FIG. 4, the flat panel display 1 includes an image display unit 41 having at least one thin film transistor and a pad unit 42 forming a plurality of terminals 45. The flat panel display 1 includes a conductive substrate on which a plurality of insulating layers are laminated to form the image display unit 41 and the pad unit 42. A substrate-exposing part 44 is formed by removing at least one area of at least one of the insulating layers formed on the pad unit 42 and then exposing the conductive substrate thereto. In addition, the flat panel display 1 includes a system control panel 48 for supplying a back bias voltage to the substrate-exposing part 44, wherein the system control panel 48 is electrically connected with the pad unit 42, and a metal member 43 for transferring the back bias voltage to the conductive substrate, wherein the metal member 43 is formed between the substrate-exposing part 44 and a system control panel 48.

In FIG. 4, the interface panel 46 and the system control panel 48 are connected with each other through one connection line 50, but of course they can be connected with a plurality of connection lines.

The conductive substrate can be formed by Stainless Steel (SUS), titanium, molybdenum, iron, and/or cobalt; but is not limited to them.

Also, the metal member 43 is connected with the substrate-exposing part 44 and transfers to the conductive substrate a back bias voltage provided from the system control panel 48, and is formed to be level with the terminals 45 formed in the pad unit 42. The metal member 43 is formed by laminating a metallic material on the substrate-exposing part 44 using evaporation and/or coating and then doing a patterning of the laminated metallic material.

The system control panel 48 further includes interface terminal 47 that are connected with the terminals 45 and the metal member 43, and a controller 49 for adjusting the back bias voltage provided to the conductive substrate. Also, the substrate-exposing part 44 is formed by removing all the insulating layers formed on the conductive substrate. The substrate-exposing part 44 can remove an insulating layer on the conductive substrate by performing a wet etching method, a dry etching method, and/or a reactive ion etching method.

The pad unit 42 forming the terminals 45 and the metal member 43 and the interface panel 46 are squeezed together and are then connected with each other with a conductive paste. The conductive paste is an anisotropic conductive film, and cracking of the paste, which can be generated by flexing the base due to pressurization or degradation in accordance with heat, can be reduced (or eliminated) by connecting the pad unit 42 with the metal member 43 by pressurizing and/or heating the anisotropic conductive film.

The back bias voltage provided for the conductive substrate through the system control panel 48 is a negative back bias voltage. For example, if the negative back bias voltage is supplied in the case of a PMOS thin film transistor, a characteristic of mobility and leakage current is enhanced and a threshold voltage is increased near "0" value. In one embodiment, the flat panel display 1 according to the present invention is an organic light emitting display.

Figure 5:
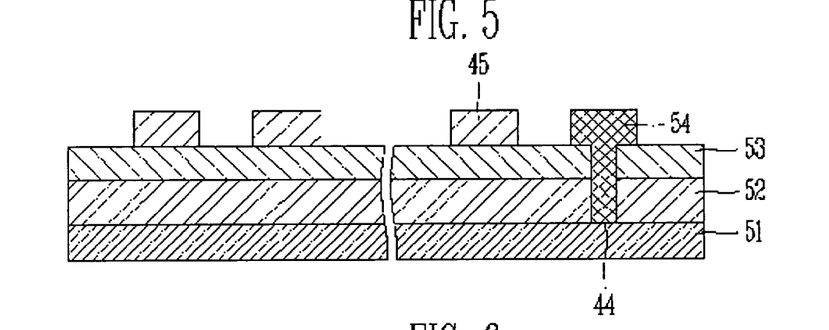
FIG. 5 illustrates a sectional view of a pad unit showing a first embodiment of the present invention taken along the II-II' line in FIG. 4.

FIG. 5 illustrates a sectional view of a pad unit showing a first embodiment of the present invention taken along the II-II' line in FIG. 4.

Referring to FIG. 5, a buffer layer 52 is formed on a conductive substrate 51 (e.g., the conductive substrate described above in FIG. 4) so as to avoid damage to the conductive substrate 51, and can be formed by an inorganic insulating material including silicon oxide ($SiO_2$) and/or silicon nitride (SiNx) or can be formed by an organic insulating material, such as an acrylic organic compound, polyamide and polyimide, etc. The buffer layer 52 in accordance with an exemplary embodiment of the present invention is formed by silicon oxide ($SiO_2$) and/or silicon nitride (SiNx), but is not limited to them.

A gate insulating layer 53 formed on the buffer layer 52 plays a role in insulating a gate electrode and a semi-conductor layer (not shown). A plurality of terminals 45 are formed on the gate insulating layer 53, and an insulating layer on the conductive substrate 51 that formed a position, on which any one of the terminals 45 is formed, is completely removed and then the substrate exposing part 44 is formed. The insulating layer can be removed by any one of a wet etching method, a dry etching method, and a reactive ion etching method.

A metal member (e.g., the metal member 43 of FIG. 4) is formed by laminating a metallic material on the substrate-exposing part using any suitable method of evaporation and coating and doing a patterning of the laminated metallic material to then form the metal member. In FIG. 5, the metal member is illustrated as a metal pin 54. The metal pin 54 is formed to be level with the terminals 45. The metal pin 54 is connected with an interface terminal (not shown) formed in an interface panel (not shown) and supplies a back bias voltage to the conductive substrate 51, to thereby enhance the mobility, the threshold and the leakage current characteristic of a thin film transistor.

Figure 6:
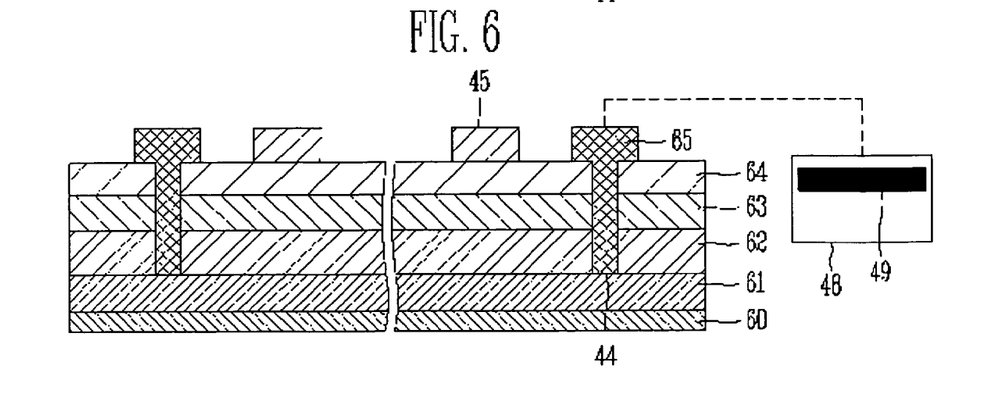
FIG. 6 illustrates a sectional view of a pad unit showing a second embodiment of the present invention taken along the II-II' line in FIG. 4.

FIG. 6 illustrates a sectional view of a pad unit showing a second embodiment of the present invention taken along the II-II' line in FIG. 4. For convenience, a specific explanation of identical element(s) in the first exemplary embodiment mentioned above will be omitted. Particularly, a specific explanation of an insulation and an insulating method formed on a conductive substrate will be omitted.

Referring to FIG. 6, a lower insulating layer 60 is formed under a conductive substrate 61 (e.g., the conductive substrate described above in FIG. 4), and the lower insulating layer 60 plays a role in reducing stress supplied to the conductive substrate 61 in case of the process. A buffer layer 62, a gate insulating layer 63, and an interinsulating layer 64 are sequentially formed on the conductive substrate 61. A plurality of terminals 45 are formed on the interinsulating layer 64, the interinsulating layer 64 on the conductive substrate 61 that formed a position, on which one of the terminals 45 is formed, is completely removed and then the substrate-exposing part 44 is formed. A metal member (e.g., the metal member 43 of FIG. 4) is formed by laminating a metallic material on the substrate-exposing part using any suitable method of evaporation and coating and doing a patterning of the laminated metallic material to form the metal member. In FIG. 6, the metal member is illustrated as a metal pin 65. The metal pin 65 is connected with an interface terminal (not shown) formed in an interface panel (not shown), and supplies a back bias voltage from the system control panel 48 forming a controller 49 to the conductive substrate 61, thereby enhancing the mobility, the threshold and the leakage current characteristic of a thin film transistor.

Figure 7:
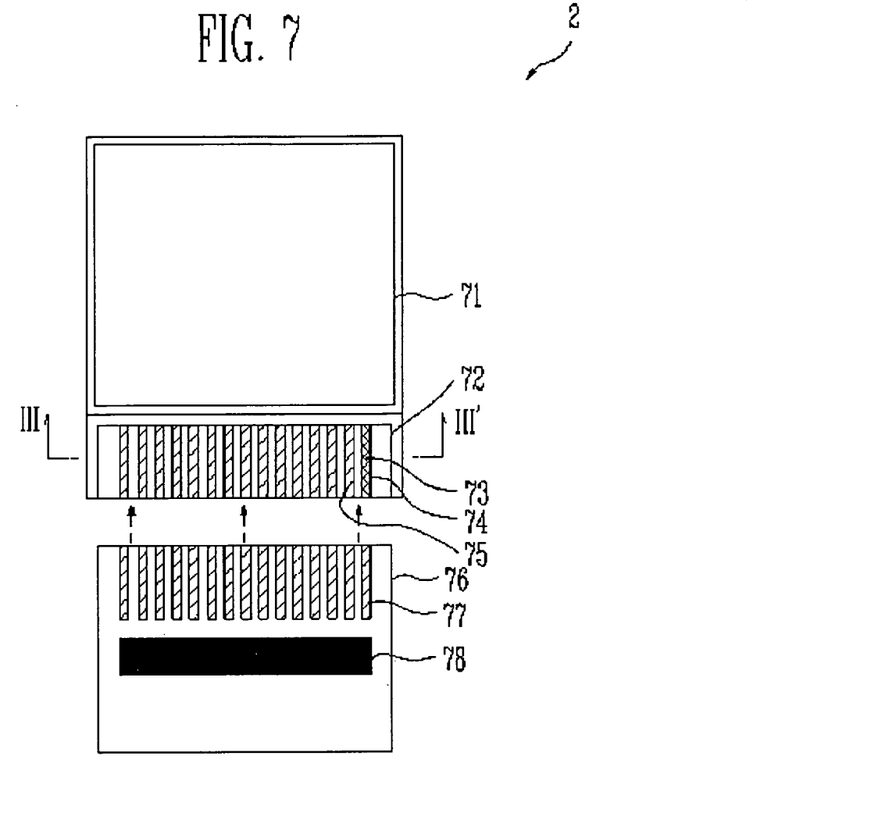
FIG. 7 illustrates a simplified plan view of a flat panel display according to an embodiment of the present invention.

FIG. 7 illustrates a simplified plan view of a flat panel display 2 according to an embodiment of the present invention.

Referring to FIG. 7, the flat panel display 2 includes an image display unit 71 having at least one thin film transistor and a pad unit 72 forming a plurality of terminals 75. The flat panel display 2 further includes a conductive substrate on which a plurality of insulating layers are laminated to form the image display unit 71 and the pad unit 72. A substrate-exposing part 74 is formed by eliminating at least one area of at least one of the insulating layers formed on the pad unit 72 and then exposing the conductive substrate thereto. In addition, the flat panel display includes a system control panel 76 for supplying a back bias voltage to the substrate-exposing part 74, wherein the system control panel 76 is electrically connected with the pad unit 72; and a metal member 73 for transferring the back bias voltage to the conductive substrate, wherein the metal member 73 is formed between the substrate-exposing part 74 and system control panel 76. The system control panel 76 forms an interface terminal 77 that is connected with the terminal 75 and a controller 78 for adjusting the back bias voltage provided to the conductive substrate, as an integral structure.

Figure 8:
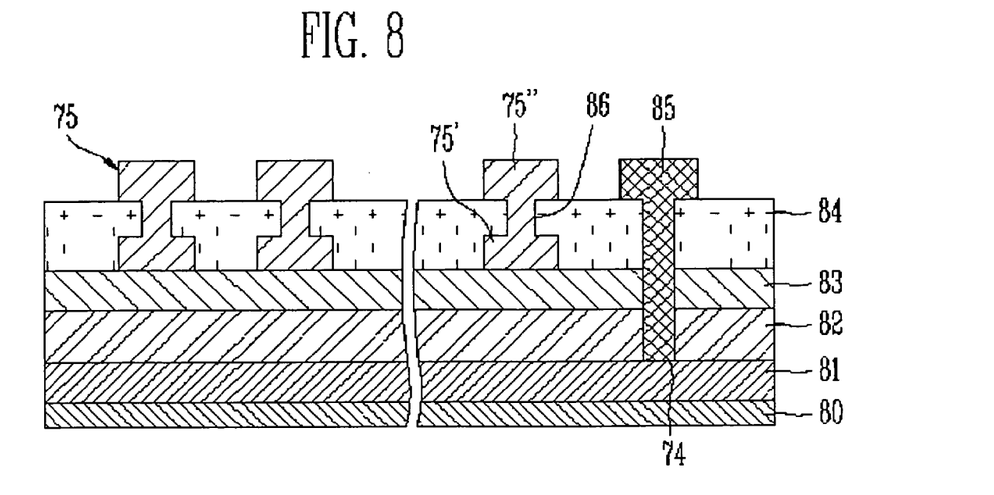
FIG. 8 illustrates a sectional view of a pad unit showing a third embodiment of the present invention taken along the III-III' line in FIG. 7.

FIG. 8 illustrates a sectional view of a pad unit showing a third embodiment of the present invention taken along the III-III' line in FIG. 7. Referring to FIG. 8, a lower insulating layer 80 is formed under of a conductive substrate 81 (e.g., the conductive substrate described above in FIG. 7); and a buffer layer 82, a gate insulating layer 83, and an interinsulating layer 84 on the conductive substrate 81 are sequentially formed. A plurality of first terminals 75' are formed on the gate insulating layer 83; the interinsulating layer 84 is formed on the plurality of first terminals 75'; and a plurality of second terminals 75'' are formed on the interinsulating layer 84. The plurality of first terminals 75' formed on the gate insulating layer 83 and the plurality of second terminals 75'' formed on the interinsulating layer 84 are electrically connected with each other through contact holes 86. An insulating layer on the conductive substrate 81 that formed a position, on which one of the terminals 75 is formed, is completely removed and then the substrate-exposing part 74 is formed. A metallic material is laminated on the substrate-exposing part 74 using any suitable method of evaporation and coating, and then a metal pin 85 is formed to be level with the terminals 75 by doing a patterning of the laminated metallic material. The metal pin 85 is connected with the interface terminal (not shown) formed in the interface panel (not shown), and supplies a back bias voltage provided from the system control panel to the conductive substrate, to thereby enhance the mobility, the threshold and the leakage current characteristic of a thin film transistor.

Figure 9A:
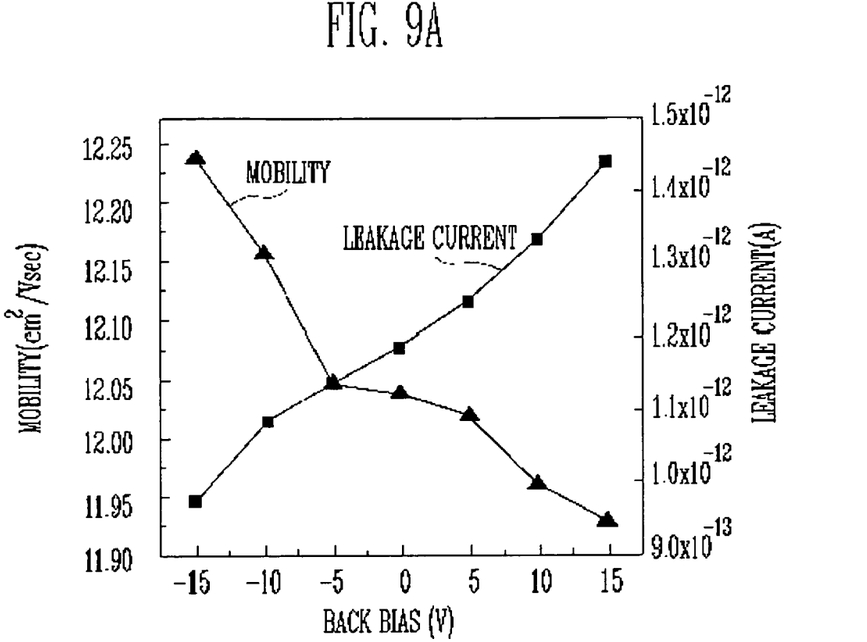
FIGS. 9A and 9B illustrate electrical characteristic cutdown in accordance with a back bias voltage supplied to a substrate of the present invention.
Figure 9B:
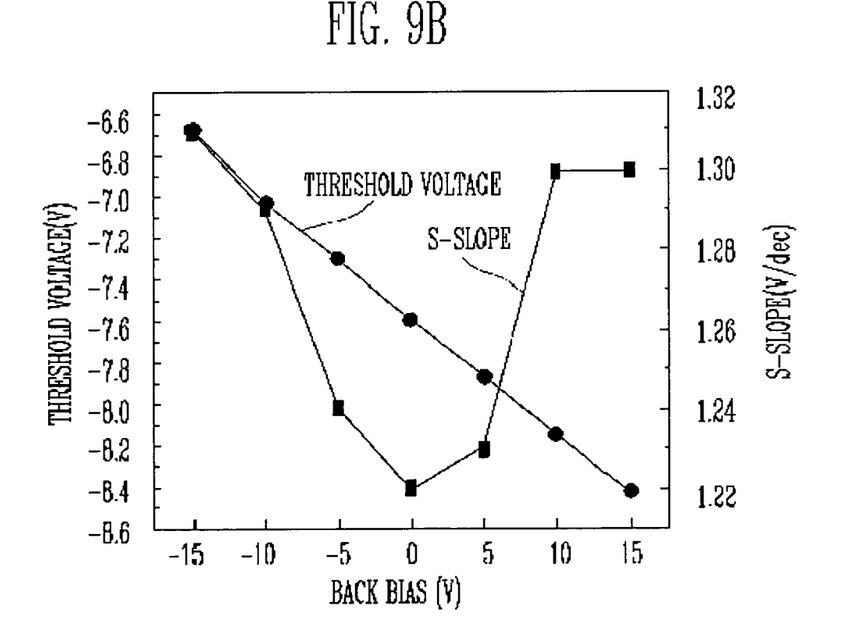

FIGS. 9A and 9B illustrate electrical characteristic cutdown in accordance with a back bias voltage supplied to a substrate of the present invention. As shown in FIG. 9A, the X-axis represents a back bias voltage supplied to a conductive substrate, and the Y-axis represents mobility and a leakage current of a low temperature poly-silicon thin film transistor formed on a conductive substrate. As depicted in a graph, if a positive bias voltage value supplied on a conductive substrate is high in case of a PMOS type thin film transistor, a leakage current of the thin film transistor element is increased, mobility is reduced and an operation characteristic is enhanced.

For example, in the case that a reverse bias voltage (−10V) is supplied to a conductive substrate, a leakage current is $1.1 \times 10^{-12}$ A and mobility is 12.15 cm$^2$/sec. On the other hand, in the case that a back bias voltage (10V) is supplied to a conductive substrate, a leakage current is $1.35 \times 10^{-12}$ A and mobility is 11.95 cm$^2$/sec. In the case that a negative back bias voltage (−15V) is supplied to a conductive substrate, a leakage current is $1.0 \times 10^{-12}$ A and mobility is 12.25 cm$^2$/sec.

An experimental result shows that if a positive back bias voltage value instead of a negative back bias voltage supplied on a conductive substrate is high in the case of a PMOS type thin film transistor, an operation characteristic in accordance with a leakage current and a mobility of the thin film transistor element is highly increased. If a negative back bias voltage is increased, the operation characteristic may be overly enhanced.

Referring to FIG. 9B, the X-axis represents a back bias voltage supplied to a conductive substrate, and the Y-axis represents a threshold voltage and an S-slope of a low temperature poly-silicon element thin film transistor formed on a conductive substrate. As depicted in a graph, if a positive back bias voltage value instead of a negative back bias voltage supplied on a conductive substrate is high in the case of a PMOS type thin film transistor, a threshold voltage is reduced and an operation characteristic of the thin film transistor element weakens; but if a negative back bias voltage is supplied on a conductive substrate, a threshold voltage is increased. If an absolute value of a back bias voltage supplied on a conductive substrate is increased, the S-slope is also increased.

For example, in the case that a back bias voltage (−10V) is supplied to a conductive substrate, the threshold voltage is −7.0V. On the other hand, in the case that a back bias voltage (10V) is supplied to a conductive substrate, the threshold voltage is −8.2V. And, in the case that a back bias voltage of −5V is supplied to a conductive substrate, the S-slope is −1.24 V/dec. On the other hand, in the case that a back bias voltage of 15V is supplied to a conductive substrate, the S-slope is 1.30V/dec.

An experimental result shows that if a negative back bias voltage value instead of a positive back bias voltage supplied on a conductive substrate is high in the case of a PMOS type thin film transistor, an operation characteristic of a threshold voltage of the thin film transistor element is highly increased. In addition, if a back bias voltage with an absolute value that is relatively large, instead of a back bias voltage with an absolute value that is relatively small, is supplied on a conductive substrate, an operation characteristic of the S-slope is highly increased.

Figure 10:
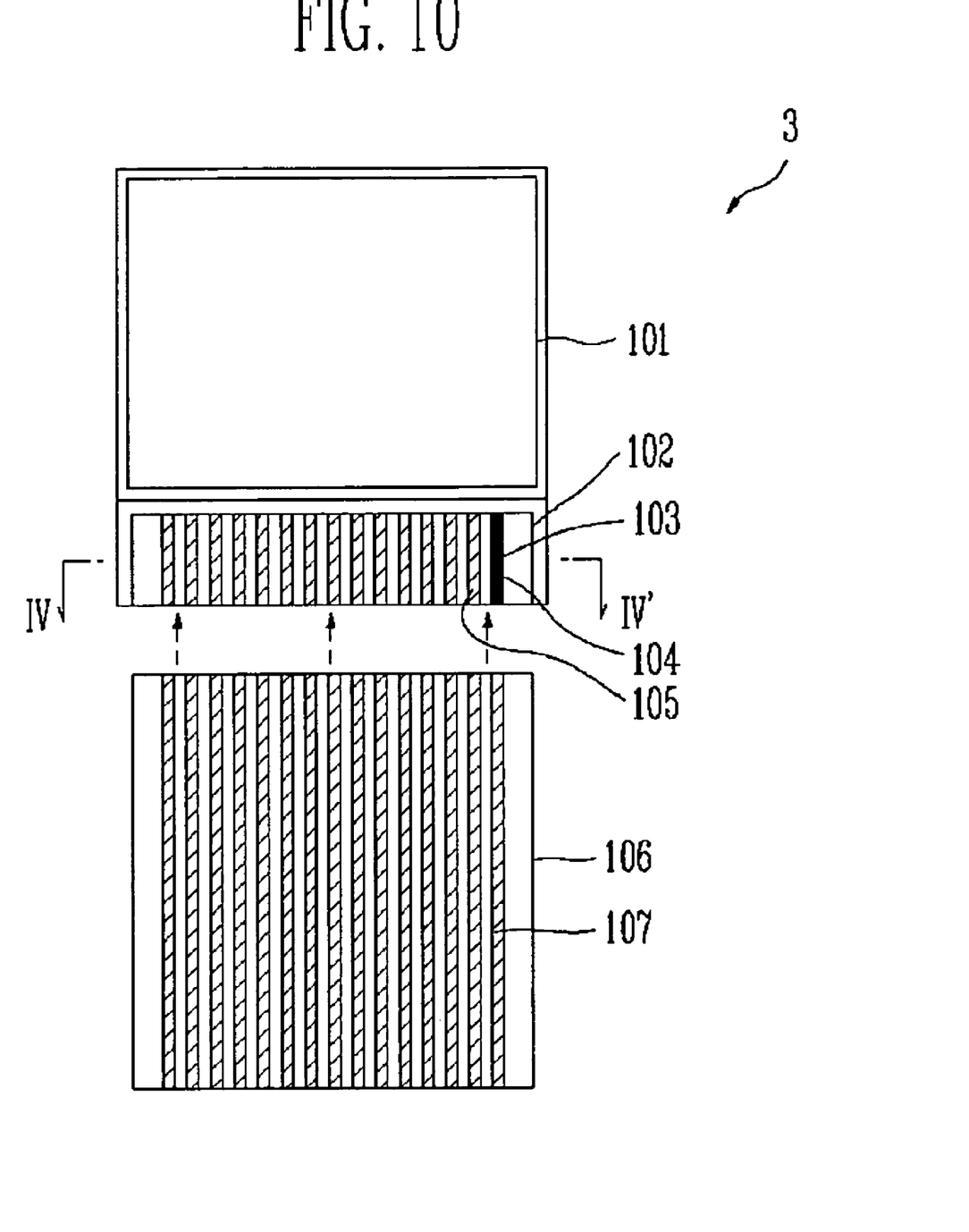
FIG. 10 illustrates a simplified plan view of a flat panel display according to an embodiment of the present invention.

FIG. 10 illustrates a simplified plan of a flat panel display 3 according to an embodiment of the present invention.

Referring to FIG. 10, the flat panel display 3 includes an image display unit 101 and a pad unit 102 forming a plurality of terminals 105.

The flat panel display 3 further includes a conductive substrate on which a plurality of insulating layers are laminated to form the image display unit 101 and the pad unit 102; a substrate-exposing part 104 formed by eliminating at least one area of the insulating layer formed on the pad unit 102 and then exposing the conductive substrate thereto; a metal member 103 provided in the substrate-exposing part 104 and contacting with the conductive substrate; and an interface panel 106 for providing the conductive substrate with a control signal provided from the outside, wherein the interface panel 106 has an interface terminal 107 connected with the terminal of the pad unit 102 and the metal member 103.

The metal member 103 plays a role in grounding the conductive substrate, wherein the metal member 103 is connected with the interface terminal 75 formed on the interface panel 106.

Figure 11:
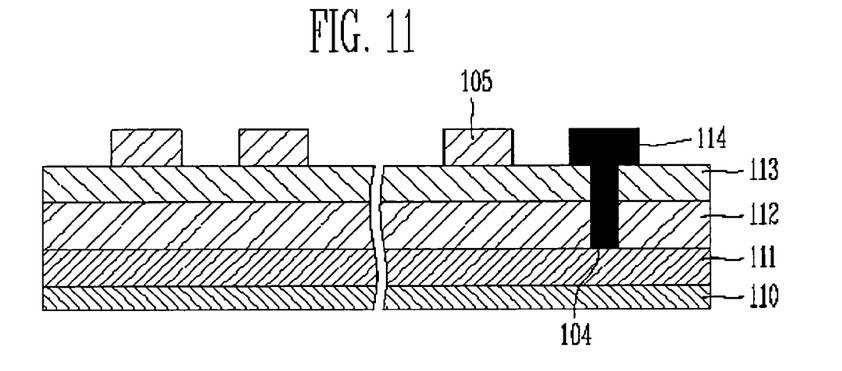
FIG. 11 illustrates a sectional view of a pad unit showing a fourth embodiment of the present invention taken along the IV-IV' line in FIG. 10.

FIG. 11 illustrates a sectional view of a pad unit showing a fourth embodiment of the present invention taken along the IV-IV' line in FIG. 10.

Referring to FIG. 11, a lower insulating layer 110 is formed under a conductive substrate 111 (e.g., the conductive substrate described above in FIG. 10), and plays a role in reducing a stress supplied to the conductive substrate 111 in case of a process.

A buffer layer 112 is formed on the conductive substrate 111 so as to avoid damage to the conductive substrate 111. A gate insulating layer 113 formed on the buffer layer 112 plays a role in insulating a gate electrode (not shown) and a semiconductor layer (not shown). A plurality of terminals 105 are formed on the gate insulating layer 113, and an insulating layer on the conductive substrate 111 that formed a position, on which any one of the terminals 105 is formed, is completely removed and then the substrate-exposing part 104 is formed.

A metallic material is laminated on the substrate-exposing part 104 using any suitable method of evaporation and coating, and then a metal pin 114 is formed by doing a patterning of the laminated metallic material. The metal pin 114 is formed to be level with the terminals 105. The metal pin 105 is connected with an interface terminal (not shown) formed in an interface panel (not shown) and supplies a back bias voltage to the conductive substrate 111, thereby avoiding cutdown of a threshold voltage generated by a voltage casually supplied to the conductive substrate 111 and/or a lot of static.

Figure 12:
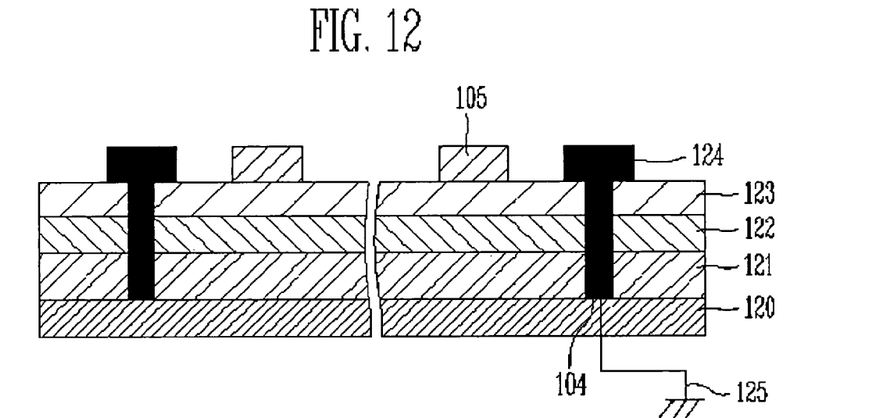
FIG. 12 illustrates a sectional view of a pad unit showing a fifth embodiment of the present invention taken along the IV-IV' line in FIG. 10.
Figure 13:
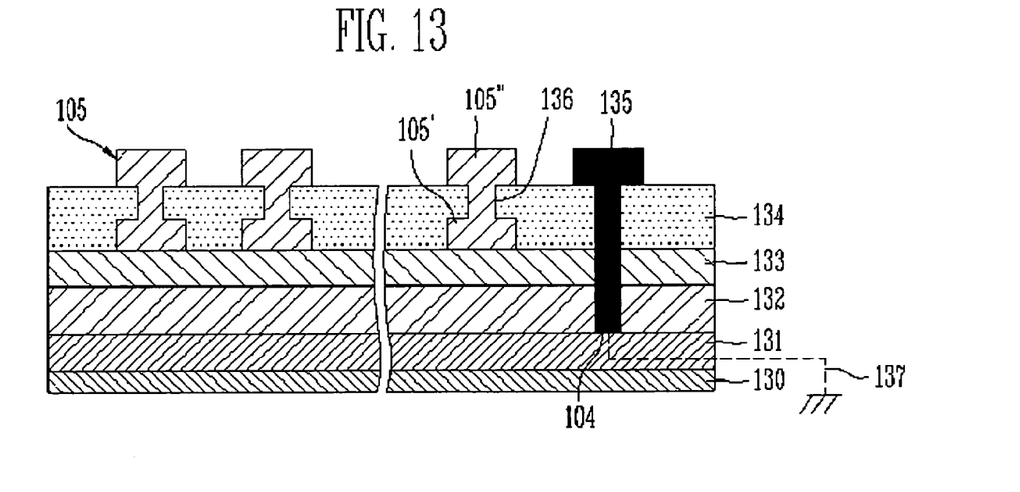
FIG. 13 illustrates a sectional view of a pad unit showing a sixth embodiment of the present invention taken along the IV-IV' line in FIG. 10.

FIGS. 12 and 13 illustrate a sectional view of a pad unit respectively showing fifth and sixth embodiments of the present invention taken along the IV-IV' line in FIG. 10. For convenience, a specific explanation of identical element(s) in the fourth exemplary embodiment mentioned above will be omitted. Particularly, a specific explanation of an insulation and a removing method formed on a conductive substrate will be omitted.

Referring to FIG. 12, a buffer layer 121, a gate insulating layer 122, and an interinsulating layer 123 are formed on a conductive substrate 120 (e.g., the conductive substrate described above in FIG. 10). A plurality of terminals 105 are formed on the interinsulating layer 123; the interinsulating layer 123 on the conductive substrate 120 that formed a position, on which any one of the terminals 105 is formed, is completely removed; and then the substrate-exposing part 104 is formed. A metal pin 124 is formed in the substrate-exposing part 104 and grounds the conductive substrate 120 through an external ground unit 125 connected with the metal pin 124, thereby avoiding cutdown of a threshold voltage generated by a voltage casually supplied to the conductive substrate 111 and/or a lot of static.

Referring to FIG. 13, a lower insulating layer 130 is formed under of a conductive substrate 131 (e.g., the conductive substrate described above in FIG. 10), and a buffer layer 132 and a gate insulating layer 133 on the conductive substrate 131 are formed. A plurality of first terminals 105' are formed on the gate insulating layer 133; an interinsulating layer 134 is formed on the plurality of first terminals 105'; and a plurality of second terminals 105" are also formed on the interinsulating layer 134. The plurality of first terminals 105' formed on the gate insulating layer 133 and the plurality of second terminals 105" formed on the interinsulating layer 134 are electrically connected with each other through contact holes 136. An insulating layer on the conductive substrate 131 that formed a position, on which any one of the terminals 105 is formed, is completely removed and then the substrate-exposing part 104 is formed. On one end of the sixth embodiment, a metal pin 135 is formed and contacts the substrate-exposing part 104, and the metal pin 135 is connected with an external interface panel (not shown) and grounds the conductive substrate 131 through an external ground unit 137 connected with the metal pin 135, thereby avoiding cutdown of a threshold voltage generated by a voltage casually supplied to the conductive substrate 131 and/or a lot of static.

As described above, in the mentioned exemplary embodiments, laminating all insulating layers formed on a conductive substrate and then etching the insulating layers form a substrate-exposing part, but a method for not forming the insulating layers can also be within the scope of the present invention by using a mask on a position on which a substrate-exposing part is formed in case of laminating insulating layers on a conductive substrate. In addition, a form position of a terminal can be diversely changed, a substrate-exposing part can be formed in more than two areas, and a formation of a metal member can be formed as another formation other than a metal pin formation.

Although an exemplary embodiment of supplying a negative back bias voltage to a conductive substrate for a PMOS thin film transistor from −0.1V to −20V has been explained, a positive back bias voltage to a conductive substrate for a NMOS thin film transistor from −0.1V to 20V should also be within the scope of the present invention because its effect is identical to that in the above described PMOS exemplary embodiment. A positive back bias voltage to a conductive substrate for a NMOS thin film transistor can, of course, be supplied.

Also, in one embodiment, a substrate-exposing part is formed on a pad unit formed on one end of a conductive substrate, and the conductive substrate is grounded by the metal pin being connected with the conductive substrate, thereby avoiding a supply of an undesired voltage and/or cutdown of a threshold voltage generated by a lot of static and/or change of luminance, gray scale, and contrast.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A flat panel display comprising:
 a conductive substrate for forming an image display unit and a pad unit separate from the image display unit, and for supplying a reverse bias voltage to at least one thin film transistor of the image display unit,
  the image display unit being formed on the conductive substrate and having the at least one thin film transistor formed on the conductive substrate, and
  the pad unit being formed on the conductive substrate and including a plurality of terminals;
 first and second insulating layers on one side of the conductive substrate to form the image display unit and the pad unit, the first insulating layer between the conductive substrate and the second insulating layer;
 a substrate-exposing part for exposing the conductive substrate, wherein the substrate-exposing part is formed by removing at least one area of both of the first and second insulating layers formed on the pad unit;
 a system control panel for supplying the reverse bias voltage through the substrate-exposing part, wherein the system control panel is electrically connected with the pad unit; and
 a metal member for transferring the reverse bias voltage to the conductive substrate, wherein the metal member is formed between the substrate-exposing part and the system control panel.

2. The flat panel display as claimed in claim 1, wherein the system control panel is electrically connected with the metal member and a corresponding one of the terminals through an interface panel.

3. The flat panel display as claimed in claim 1, wherein the system control panel further comprises an interface terminal electrically connected with a corresponding one of the terminals and the metal member, and a controller for adjusting the reverse bias voltage provided to the conductive substrate.

4. The flat panel display as claimed in claim 2, wherein the metal member comprises a metal pin formed at a same height level as the terminals.

5. The flat panel display as claimed in claim 1, wherein the at least one thin film transistor is PMOS type, and wherein the reverse bias voltage supplied to the conductive substrate is a negative reverse bias voltage.

6. The flat panel display as claimed in claim 1, wherein the at least one thin film transistor is NMOS type, and wherein the reverse bias voltage supplied to the conductive substrate is a positive reverse bias voltage.

7. The flat panel display as claimed in claim 5, wherein the negative reverse bias voltage ranging from −0.1V to −20V is supplied to the conductive substrate.

8. The flat panel display as claimed in claim 6, wherein the positive reverse bias voltage ranging from 0.1V to 20V is supplied to the conductive substrate.

9. The flat panel display as claimed in claim 2, wherein the pad unit formed with the corresponding one of the terminals and the metal member is press-connected with the interface panel by a conductive paste.

10. The flat panel display as claimed in claim 1, wherein the substrate-exposing part is formed by completely removing the first and second insulating layers in the at least one area of both of the first and second insulating layers to expose the conductive substrate.

11. The flat panel display as claimed in claim 10, wherein the insulating layers are removed through a wet etching method, a dry etching method and/or a reactive ion etching method.

12. The flat panel display as claimed in claim 1, wherein the metal member is formed by laminating a metallic material on the substrate-exposing part using either a evaporation method or a coating method, and by patterning the laminated metallic material.

13. The flat panel display as claimed in claim 1, wherein the conductive substrate comprises Stainless Steel, titanium, molybdenum, iron, and/or cobalt.

14. A method for driving a flat panel display including a conductive substrate for forming an image display unit and a pad unit separate from the image display unit, and for supplying a reverse bias voltage to at least one thin film transistor of the image display unit, the image display unit being formed on the conductive substrate and having the at least one thin film transistor formed on the conductive substrate, and the pad unit being formed on the conductive substrate and including a plurality of terminals; first and second insulating layers on one side of the conductive substrate to form the image display unit and the pad unit, the first insulating layer between the conductive substrate and the second insulating layer; a substrate-exposing part for exposing the conductive substrate, wherein the substrate-exposing part is formed by removing at least one area of both of the first and second insulating layers formed on the pad unit; a system control panel for supplying the reverse bias voltage through the substrate-exposing part, wherein the system control panel is electrically connected with the pad unit; and a metal member for transferring the reverse bias voltage to the conductive substrate, wherein the metal member is formed between the substrate-exposing part and the system control panel, the method comprising:
supplying the reverse bias voltage to the conductive substrate through the system control panel electrically connected with the substrate-exposing part.

15. The method as claimed in claim 14, wherein the at least one thin film transistor is PMOS type, and wherein the reverse bias voltage supplied to the conductive substrate is a negative reverse bias voltage.

16. The method as claimed in claim 14, wherein the at least one thin film transistor is NMOS type, and wherein the reverse bias voltage is supplied to the conductive substrate is a positive reverse bias voltage.

17. The method as claimed in claim 15, wherein the negative reverse bias voltage ranging from −0.1V to −20V is supplied to the conductive substrate.

18. The method as claimed in claim 16, wherein the positive reverse bias voltage ranging from 0.1V to 20V is supplied to the conductive substrate.

19. A flat panel display comprising:
a conductive substrate for forming an image display unit and a pad unit separate from the image display unit, and for supplying a reverse bias voltage to at least one thin film transistor of the image display unit,
the image display unit being formed on the conductive substrate and having the at least one thin film transistor formed on the conductive substrate, and
the pad unit being formed on the conductive substrate and including a plurality of terminals;
first and second insulating layers on one side of the conductive substrate to form the image display unit and the pad unit, the first insulating layer between the conductive substrate and the second insulating layer;
a substrate-exposing part formed on at least one area of the pad unit and exposing the conductive substrate through the first and second insulating layers;
a metal member provided in the substrate-exposing part and contacting the conductive substrate; and
an interface panel for providing the conductive substrate with an external control signal, wherein the interface panel has an interface terminal connected with the pad unit and the metal member.

20. The flat panel display as claimed in claim 19, further comprising a ground part for grounding the conductive substrate, wherein the ground part is connected with the metal member.

21. The flat panel display as claimed in claim 19, further comprising a lower insulating layer formed under the conductive substrate.

22. A method for controlling a characteristic of a flat panel display, the method comprising:
laminating a conductive substrate for forming an image display unit and a pad unit separate from the image display unit, and for supplying a reverse bias voltage to at least one thin film transistor of the image display unit, with first and second insulating layers on one side of the conductive substrate to form the image display unit having the at least one thin film transistor formed on the conductive substrate, and the pad unit being formed on the conductive substrate and having a plurality of terminals, the first insulating layer being between the conductive substrate and the second insulating layer;
removing at least one area of both of the first and second insulating layers on the pad unit to expose the conductive substrate to form a substrate-exposing part;
supplying the reverse bias voltage from a system control panel through the substrate-exposing part, wherein the system control panel is electrically connected with the pad unit;
forming a metal member for transferring the reverse bias voltage to the conductive substrate, wherein the metal member is formed between the substrate-exposing part and system control panel; and
supplying the reverse bias voltage to the conductive substrate through the system control panel electrically connected with the substrate-exposing part.

* * * * *

UNITED STATES PATENT AND TRADEMARK OFFICE
CERTIFICATE OF CORRECTION

PATENT NO. : 7,995,023 B2  Page 1 of 1
APPLICATION NO. : 11/478169
DATED : August 9, 2011
INVENTOR(S) : Jae Kyeong Jeong et al.

It is certified that error appears in the above-identified patent and that said Letters Patent is hereby corrected as shown below:

In the Claims

Column 11, Claim 12, line 22    Before "evaporation" Delete "a" Insert -- an --

Signed and Sealed this
Fifth Day of June, 2012

David J. Kappos
*Director of the United States Patent and Trademark Office*